United States Patent [19]

Westendorp et al.

[11] Patent Number: 5,167,761

[45] Date of Patent: Dec. 1, 1992

[54] METHOD FOR HALIDE ETCHING IN THE PRESENCE OF WATER OF SEMI-CONDUCTOR SUBSTRATES

[75] Inventors: Johannes F. M. Westendorp, Amsterdam; Hans W. Piekaar, Utrecht, both of Netherlands

[73] Assignee: ASM International N.V., Bilthoven, Netherlands

[21] Appl. No.: 766,171

[22] Filed: Sep. 23, 1991

Related U.S. Application Data

[63] Continuation of Ser. No. 431,149, Nov. 3, 1989, abandoned.

[51] Int. Cl.$^5$ .............................................. C03C 15/00
[52] U.S. Cl. .................................... 156/646; 156/635; 252/79.3; 134/3; 134/31
[58] Field of Search ............... 156/635, 646, 643, 662; 252/79.3, 79.1; 134/2, 3, 31

[56] References Cited

U.S. PATENT DOCUMENTS

| | | | |
|---|---|---|---|
| 4,229,247 | 10/1980 | Chiu et al. | 156/646 X |
| 4,605,479 | 8/1986 | Faith, Jr. | 204/192.17 |
| 4,749,440 | 6/1988 | Blackwood et al. | 156/646 |
| 5,078,832 | 1/1992 | Tanaka | 156/640 X |

*Primary Examiner*—Thi Dang
*Attorney, Agent, or Firm*—Young & Thompson

[57] ABSTRACT

A process for halide etching of a semi-conductor substrate in the presence of water. Etching is realized in a reaction vessel. The process steps comprise filling of the reaction vessel with a first gas to a first pressure and subsequently filling the reaction vessel with a second gas to a second pressure after which the substrate is left in the reaction vessel for several minutes to obtain the etching required. One of the gases is HF and the other of the gases is water vapor. The etching is conducted at sub-atmospheric pressure, preferably below 50 Torr.

7 Claims, No Drawings

METHOD FOR HALIDE ETCHING IN THE PRESENCE OF WATER OF SEMI-CONDUCTOR SUBSTRATES

This application is a continuation of Ser. No. 07/431,149, filed Nov. 3, 1989, now abandoned.

BACKGROUND OF THE INVENTION

1. Field of the invention

This invention relates to the process of removing and vaporizing small layers from semi-conductor substrate materials with halide gases in the presence of water. More particular it relates to removing and vaporizing native oxides in contact holes etc., in order to prepare a wafer for a subsequent step, specifically to try to restore the interface to a virginal state so as to be able to e.g. grow epitaxial silicon, grow selective W, selective metal silicides etc., or to realize very thin, very uniform and very reliable oxide layers to be used for gates, dielectrics etc. For all of this the interface has in any case to be free from organic or metal debris. In the art this is done in a wet etch. However, a wet etch is of limited use if the feature size is such that the liquid surface tension prevents the reactant to reach the very bottom of e.g. the contact hole. Because of that a wet etch is incapable of completely removing the oxide built-up (typically 10 to 20 Å thick) in deep contact holes.

2. Description of the prior art

Because of this in the prior art, e.g. U.S. Pat. No. 4,749,440 it is proposed to use a gaseous etch to remove this so called native oxide in order to clean the interface. This gaseous etch does not have surface tension. In the method according to the above U.S. specification halide gas does enter the reaction chamber at near atmospheric pressure in the presence of water. The flow of the halide is controlled by a mass flow controller and with a vent continuously open to atmosphere or throttled to increase the pressure. The etch time is typically between 5 and 30 seconds.

The use of a mass flow controller in a dynamic process gives rise to several problems. First of all the mass flow controller has to be constructed from a material resistant to the reactive gases used. Furthermore it has been found that it is extremely difficult to exactly control the rate of etching with a fluctuating flow of etchant gas and therefore at fluctuating partial pressures.

The nature of the application in the prior art requires a process on a single wafer to be finished within 5–30 s. i.e. etching of hundreds to thousands of Å at relatively high etch rate. It has been established that actual etching may suffer from a delay in time ranging from 1 second up to 5 minutes. This is a phenomenon not understood. Therefore in 5–30 s. one can either have zero etching or many thousands of Å removed either locally or all over the wafer. Of course this is unacceptable. This is particular true when dealing with patterned wafers. It should not be that when the removal of 30 Å of a native oxide is required, intentially deposited oxide layers are also for the most part removed because of an appreciable overetch.

SUMMARY OF THE INVENTION

The invention aims to obviate these drawbacks.

According to the invention this is realized in that a method for etching with a halide in the presence of water of a semi-conductor substrate placed in a chamber, comprising the introducing of a first gas until a first pressure is reached and subsequently introducing of a second gas until a second higher pressure is reached. In contrast to the prior art this is a static method.

In contrast to the prior art the quantity of reactive gas and the mixing ratio with the other components present in the reaction chamber is no longer measured with a mass flow device, but is related to the pressure. This means that a relatively simple pressure measuring device can be used giving a considerably improved accuracy over the method according to the prior art. After the gases are introduced in the reaction chamber the substrate is left alone so that the reaction can take place. During the reaction the concentration of reactive gas will decrease such that the start and end of the reaction can be exactly determined.

In contrast to the not very reliable mass flow controllers for halides, such as HF, where the output may vary between 20 to 50% over e.g. 100 runs, measuring the pressure can always be done exactly. It has to be remarked that the etching rate is dependent on the fourth power of the HF concentration.

To further control the reaction rate according to the invention this rate is considerably decreased. The invention aims to realize an etching time in the order of minutes and not of seconds, such as with the prior art. This is realized in that the pressure within the reaction chamber is a subatmospheric pressure and preferably lower than 50 Torr. Under these circumstances etching between 1 and 10 minutes becomes possible. In that circumstance it is of course preferable to work batch-wise.

In contrast to the prior art the method according to the invention can be used with a batch comprising a plurality of substrates. At high pressure and short reaction times it is hardly possible to obtain uniform etching over the several substrates in a reaction vessel. Almost certainly problems with diffusion of the reaction gas which must be equal at all points of all substrates, will occur.

In the method according to the invention first of all time is gained to more uniformly mingle the reactive gases. Furthermore by having a lower pressure the diffusion constants will increase as they are inversely proportional to the pressure. Because of this only now it has be found possible to etch batch-wise.

Preferably etching is done at room temperature and if the wafer temperature increases the etch rate does decrease. This rate of varying is quite considerable at room temperature. This means that an increase or decrease of 5° C. has a considerable effect on the etching rate. However, means to exactly control the temperature of the wafer are complicated.

According to the invention wherein the etch time is increased relative to the prior art the process is controlled in that the temperature is measured and referring to these values the etch time or the HF/H$_2$O ratio is determined. E.g. this can be done with a processor in which the known exact temperature and HF/H$_2$O ratio dependent etch rate are stored. In this way the effect of changing ambient temperatures can be taken into account by changing the etch time or partial pressure of the halide and water rather than trying to force the substrate to be a certain fixed temperature. Most of the reactions proposed in the reaction chamber will give a change in pressure. If this variation in pressure is measured with the pressure sensors being provided, problems described above with regard to inhibition time can be obviated because a clear indication is found of starting, course and completion of the reaction.

DESCRIPTION OF PREFERRED EMBODIMENT

Example

The method according to the subject invention was realized in a reaction chamber equipped with three inlets: one for anhydrous HF, one for water vapor and one for a dry $N_2$ purge. The inlet lines were combined at a distance of about 50 cm above the reactor. Subsequently the reactor chamber was loaded with a batch of wafers being kept at ambient temperature. After this the reaction chamber loaded with wafers was evacuated and filled with the reactant gases.

Monitoring the pressure during a 20-50 Å/min etch process, it potentially makes possible to accurately etch away e.g. no more than 30 Å by pumping off the reactant gases after a certain pressure change. The reactor and associated equipment according to the invention was made from materials chemically resistant to the reactive $HF$-$H_2O$ mixture. A proper choice is of great importance as the entire purpose of the etch is defeated if corrosion would lead to an excessive generation of particles from either the reactor walls, the wafer support structure, the gas feed lines, etc.

After evacuating of the reaction chamber the valve to the pump is closed. After this first of all the inlet of water vapor is opened and water vapor is injected into the reactor up to a certain pressure. The water vapor inlet is closed and the wafers are left to reside in the water vapour ambient until the next step. After this the inlet of anhydrous HF vapor is opened and anhydrous HF is supplied in the reactor. The amount of anhydrous HF supplied into the reactor is measured to determine the required $HF/H_2O$ ratio.

By measuring the partial pressures the quantity of HF introduced can be measured exactly. The wafers are subsequently kept isolated for a time being the sum of the inhibition time plus the actual etch step time, the latter being typically between 2 and 5 minutes. The temperature of the wafers is fed in a microprocessor in which a program is stored comprising the dependencies of the etching process on the temperature, pressure, $HF/H_2o$ ratio etc. With this microprocessor the actual etching time or $HF/H_2O$ ratio is determined to give the desired etch. After said time interval has elapsed the pump valve is opened and the process gases are pumped away. By monitoring the pressure drop the start of the reaction can be determined and the course of the reaction can be followed.

Although the invention is described referring to a preferred embodiment it has to be understood that the invention is not limited to this application. E.g. any gas other than HF might be used.

We claim:

1. A method for chemically etching native oxides from a substrate with a halide gas in the presence of water vapor in an etching chamber, comprising introducing a substrate having native oxides thereon into a said etching chamber, introducing one of a halide gas and water vapor as a first gas into the etching chamber until a first pressure is reached, the substrate being inert to the first gas alone, and subsequently introducing the other of said halide gas and water vapor as a second gas into the etching chamber until a pressure higher than said first pressure is reached, the first and second gases together being effective to etch said native oxides from said substrate, and leaving said substrate in said etching chamber in contact with said first and second gases until a predetermined degree of etching is effected.

2. A method as claimed in claim 1, in which said higher pressure is lower than 50 Torr.

3. A method as claimed in claim 1, in which the halide gas is hydrogen fluoride gas.

4. A method as claimed in claim 1, wherein said etching is conducted at about room temperature.

5. A method as claimed in claim 1, in which the duration of said etching is between 1 and 10 minutes.

6. A method as claimed in claim 1, in which the second gas is hydrogen fluoride and the first gas is water vapor.

7. A method as claimed in claim 1, and evacuating said etching chamber between introduction of said substrate therein and the introduction of said first gas therein.

* * * * *